United States Patent
Cheng et al.

(10) Patent No.: US 7,557,012 B2
(45) Date of Patent: Jul. 7, 2009

(54) METHOD FOR FORMING SURFACE STRAP

(75) Inventors: Chih-Hao Cheng, Taipei County (TW);
Tzung-Han Lee, Taipei (TW);
Chung-Yuan Lee, Tao-Yuan (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 0 days.

(21) Appl. No.: 11/940,308

(22) Filed: Nov. 14, 2007

(65) Prior Publication Data
US 2008/0305605 A1 Dec. 11, 2008

(30) Foreign Application Priority Data
Jun. 6, 2007 (TW) .............. 96120384 A

(51) Int. Cl.
*H01L 27/108* (2006.01)

(52) U.S. Cl. ............... 438/387; 438/391; 257/E27.092; 257/E29.346

(58) Field of Classification Search ........... 438/391, 438/389, 387; 257/E27.092, E29.346
See application file for complete search history.

(56) References Cited

U.S. PATENT DOCUMENTS

| | | | | |
|---|---|---|---|---|
| 5,014,099 A | * | 5/1991 | McElroy | 257/302 |
| 5,075,248 A | * | 12/1991 | Yoon et al. | 438/244 |
| 5,471,087 A | * | 11/1995 | Buerger, Jr. | 257/532 |
| 5,545,583 A | * | 8/1996 | Lam et al. | 438/386 |
| 6,309,924 B1 | * | 10/2001 | Divakaruni et al. | 438/243 |
| 6,458,647 B1 | * | 10/2002 | Tews et al. | 438/246 |
| 2005/0191807 A1 | * | 9/2005 | Yang | 438/248 |
| 2007/0032033 A1 | * | 2/2007 | Heineck et al. | 438/386 |

* cited by examiner

*Primary Examiner*—Davienne Monbleau
*Assistant Examiner*—Allen L Parker
(74) *Attorney, Agent, or Firm*—Winston Hsu

(57) ABSTRACT

A method for forming a surface strap includes forming a deep trench capacitor having a conductive connection layer on its surface in the substrate and the conductive connection layer in contact with the conductive layer; forming a poly-Si layer covering the pad layer and the conductive connection layer; performing a selective ion implantation with an angle to make part of the poly-Si layer an undoped poly-Si layer; removing the undoped poly-Si layer to expose part of the conductive connection layer; etching the exposed conductive connection layer to form a recess; removing the poly-Si layer to make the exposed conductive connection layer a conductive connection strap; filling the recess with an insulation material to form a shallow trench isolation; exposing the conductive layer; and selectively removing the conductive layer to form a first conductive strap which forms the surface strap together with the conductive connection strap.

3 Claims, 9 Drawing Sheets

METHOD FOR FORMING SURFACE STRAP

BACKGROUND OF THE INVENTION

1. Field of the Invention

The present invention relates to a method for forming a conductive strap. In particular, the present invention relates to a method for forming a conductive strap on the surface of a substrate.

2. Description of the Prior Art

A DRAM unit is made of a metal oxide semiconductor (MOS) transistor in series connection with a capacitor. In the current DRAM process, the capacitor is designed to be a stack capacitor on the surface of the substrate or a deep trench capacitor buried in the substrate.

Because the deep trench capacitor is deeply buried in the substrate, conventionally a buried strap is used to electrically connect the drain and the deep trench capacitor in the MOS. However, in order to avoid the strong electric field caused by the drain and the buried strap as the electrical connection in the MOS to damage the performance of the devices, such as the raise of the dark current, the gate channel region is accordingly arranged in a deeper trench to keep a distance from the strong electric field in the vicinity of the buried strap as far away as possible.

However, in addition to the fact that it is well known that it is not an optimal solution since it is very complicated and difficult to set the gate channel region in a gate trench of high aspect ratio plus the difficulty to control such device, high integration, shrinkage of the dimension of the capacitor as well as the shorter and shorter distance of the neighboring elements all cause the electric resistance of the buried strap to dramatically increase. Besides, the method for forming the conventional single buried strap at the collar of the trench capacitor in the trench capacitor DRAM structure is complicated and needs improving.

Therefore, it is needed to provide a novel method for forming the conductive strap. On one hand the gate channel region may keep a distance from the strong electric field in the vicinity of the buried strap as far away as possible and on the other hand the conductive strap may have a larger contact area as well as to omit the conventional single buried strap at the collar of the trench capacitor to simplify the process.

SUMMARY OF THE INVENTION

The present invention provides a novel method for forming the conductive strap, which is formed on the substrate rather than in the substrate. This method can effectively solve the problem that the strong electric field in the vicinity of the buried strap has negative influence on the performance of the devices.

The method for forming a surface strap of the present invention includes:

providing a substrate including a conductive layer and a pad layer;

forming a deep trench capacitor having a conductive connection layer on its surface in the substrate and the conductive connection layer in contact with the conductive layer;

forming a poly-Si layer covering the pad layer and the conductive connection layer;

performing a selective ion implantation with an angle to make part of the poly-Si layer above the conductive connection layer an undoped poly-Si layer;

removing the undoped poly-Si layer to expose part of the conductive connection layer;

etching the exposed conductive connection layer to form a recess;

removing the poly-Si layer to make the exposed conductive connection layer a conductive connection strap;

filling the recess with an insulation material covering the conductive connection strap to form a shallow trench isolation;

removing the pad layer to expose the conductive layer; and selectively removing the conductive layer to form a first conductive strap which forms the surface strap together with the conductive connection strap.

The present invention provides a method for forming a surface strap. First the method of the present invention intervenes between the procedure of the deep trench capacitor and the procedure of the gate and accordingly acts as the hard mask of the procedure of the deep trench capacitor. Moreover performing the procedure of the surface strap before the procedure of the gate may simplify the process. Furthermore, if the conductive strap is made of a material with conductivity better than poly-Si, the electric resistance between the drain and the deep trench capacitor may be substantially lowered.

These and other objectives of the present invention will no doubt become obvious to those of ordinary skill in the art after reading the following detailed description of the preferred embodiment that is illustrated in the various figures and drawings.

DETAILED DESCRIPTION

The present invention discloses a method for forming the surface strap characterized in that the surface strap connecting the capacitor to the drain is formed on the substrate rather than in the substrate. This method can effectively solve the problem that the strong electric field in the vicinity of the buried strap has negative influence on the performance of the devices. Second the method of the present invention intervening between the procedure of the deep trench capacitor and the procedure of the gate and may accordingly act as the hard mask of the procedure of the deep trench capacitor. Moreover performing the procedure of the surface strap before the procedure of the gate may simplify the process. Furthermore, if the conductive strap is made of a material with conductivity better than poly-Si, the electric resistance between the drain and the deep trench capacitor may be substantially lowered.

FIG. 1 to FIG. 9 illustrate the method for forming the surface strap of the present invention. Please refer to FIG. 1. The method for forming the surface strap of the present invention first provides a substrate 100 including a conductive layer 101 and a pad layer 102. The substrate 100 may be a semiconductor substrate. The conductive layer 101 may include a conductive material such as metal or non-metal, for example, poly-Si, Ti, TiN, W, Ta, TaN or graphite and preferably graphite. The thickness of the conductive layer depends on the material. For example, if the conductive layer 101 includes a metal, the thickness of the conductive layer depends on the size of the metal atoms and can be as thin as 3 atoms. If the conductive layer 101 includes a non-metal, such as poly-Si or graphite, the conductive layer 101 may have a thickness of about 500 Å, but is not limited to this. The pad layer 102 may include a nitride or an oxynitride, such as silicon nitride or silicon oxynitride.

Figure 1:
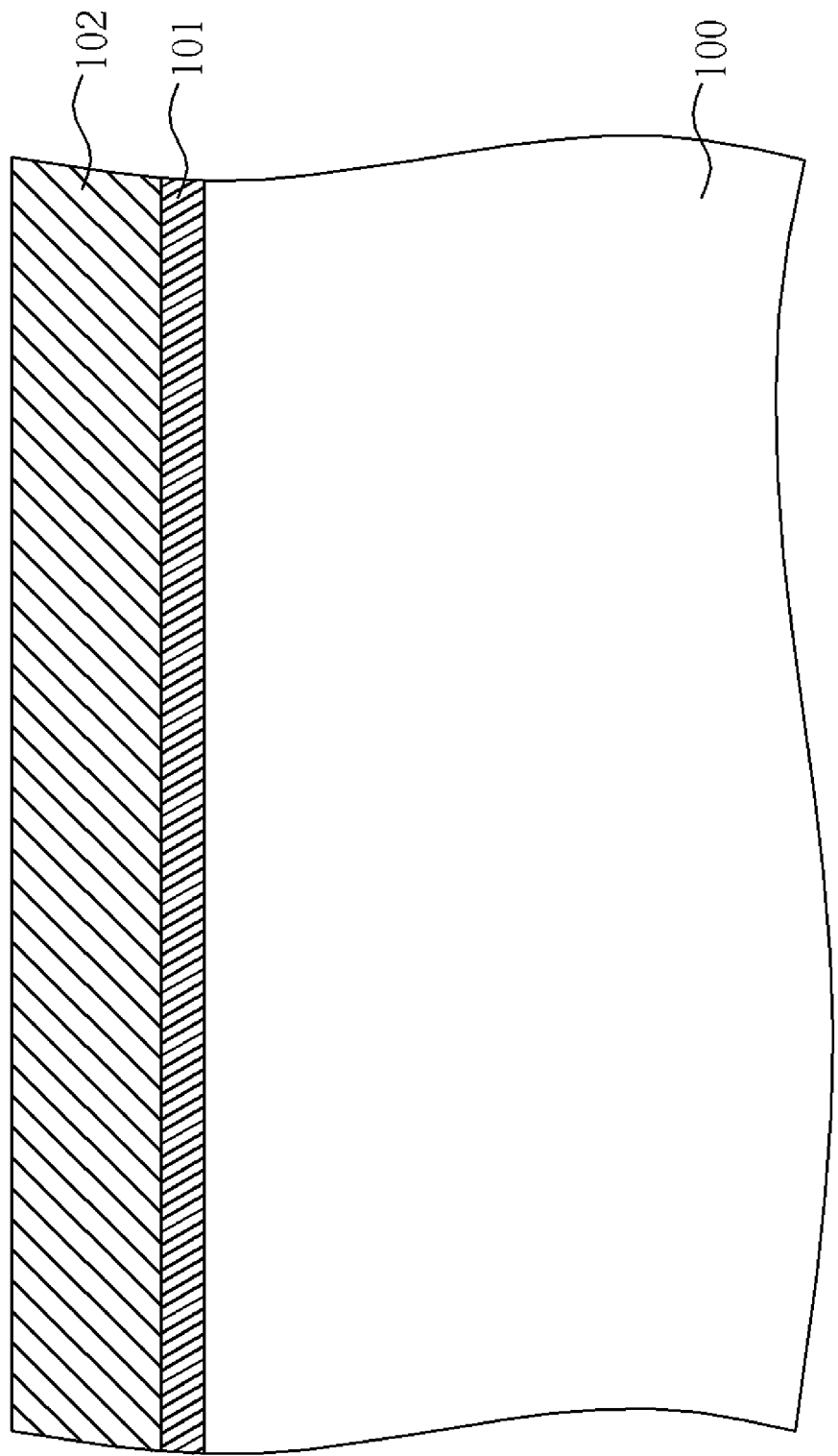
FIG. 1 to FIG. 9 illustrate the method for forming the surface strap of the present invention.
Figure 2:
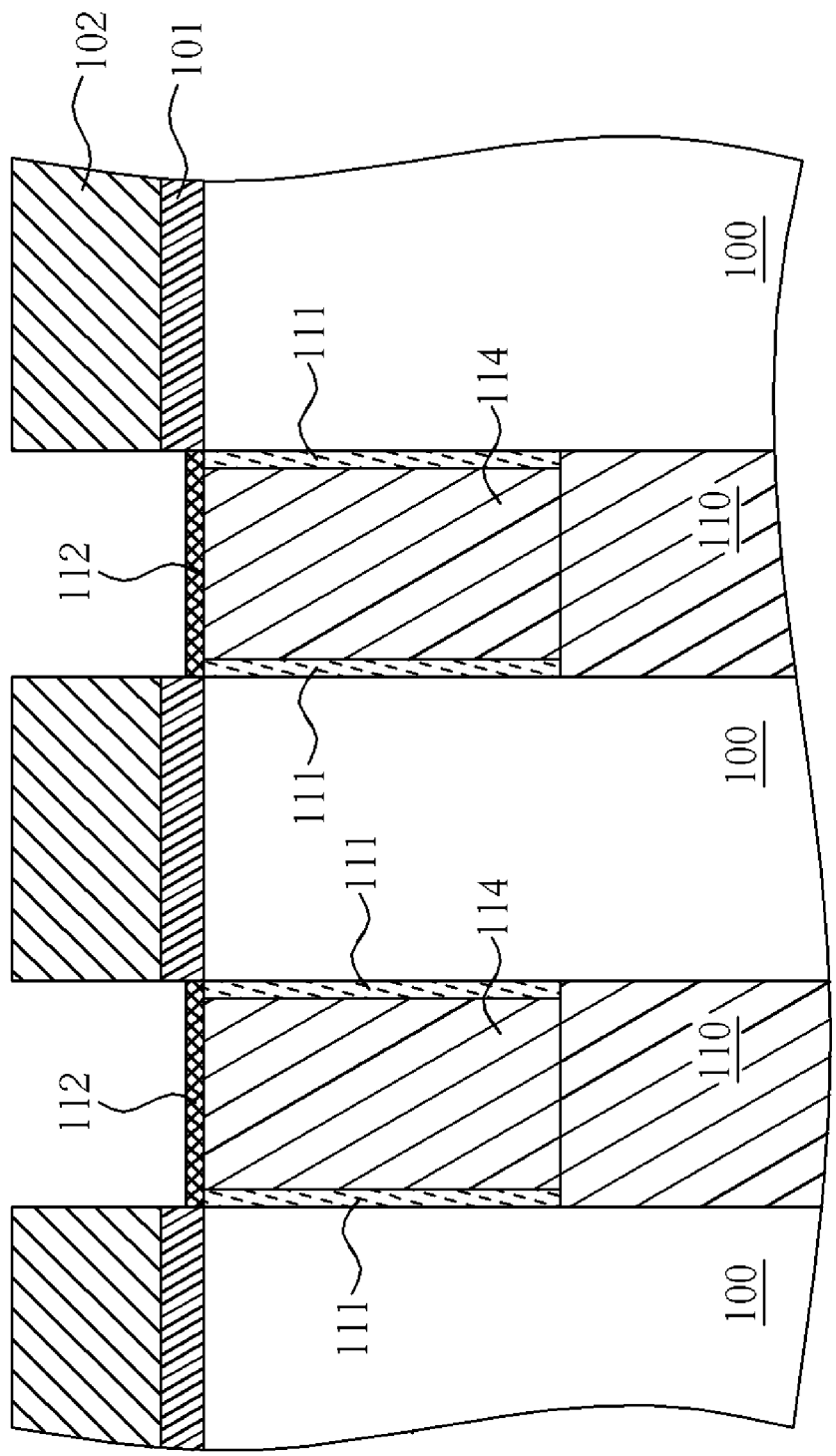

Before the procedure of the surface strap as shown in FIG. 2, a deep trench capacitor 110 including the collar insulator 111, the capacitor content 114 surrounded by the collar insulator 111 and a conductive connection layer 112 in contact with the conductive layer 101 on the substrate 100 surface is formed in the substrate 100. The deep trench capacitor 110 may be formed by conventional methods, such as lithography and etching. Preferably, the pad layer 102 may serve as the hard mask for etching to form the deep trench capacitor 110. The conductive connection layer 112 may be formed by conventional methods such as epitaxial growth and include a conductive material such as metal or non-metal, for example, poly-Si, Ti, TiN, W, Ta, TaN or graphite and preferably graphite. The thickness of the conductive layer depends on the material. For example, if the conductive connection layer 112 includes a metal, the thickness of the conductive layer depends on the size of the metal atoms and can be as thin as 3 atoms. If the conductive connection layer 112 includes a non-metal, such as poly-Si or graphite, the conductive connection layer 112 may have a thickness of about 500 Å, but is not limited to this.

Figure 3:
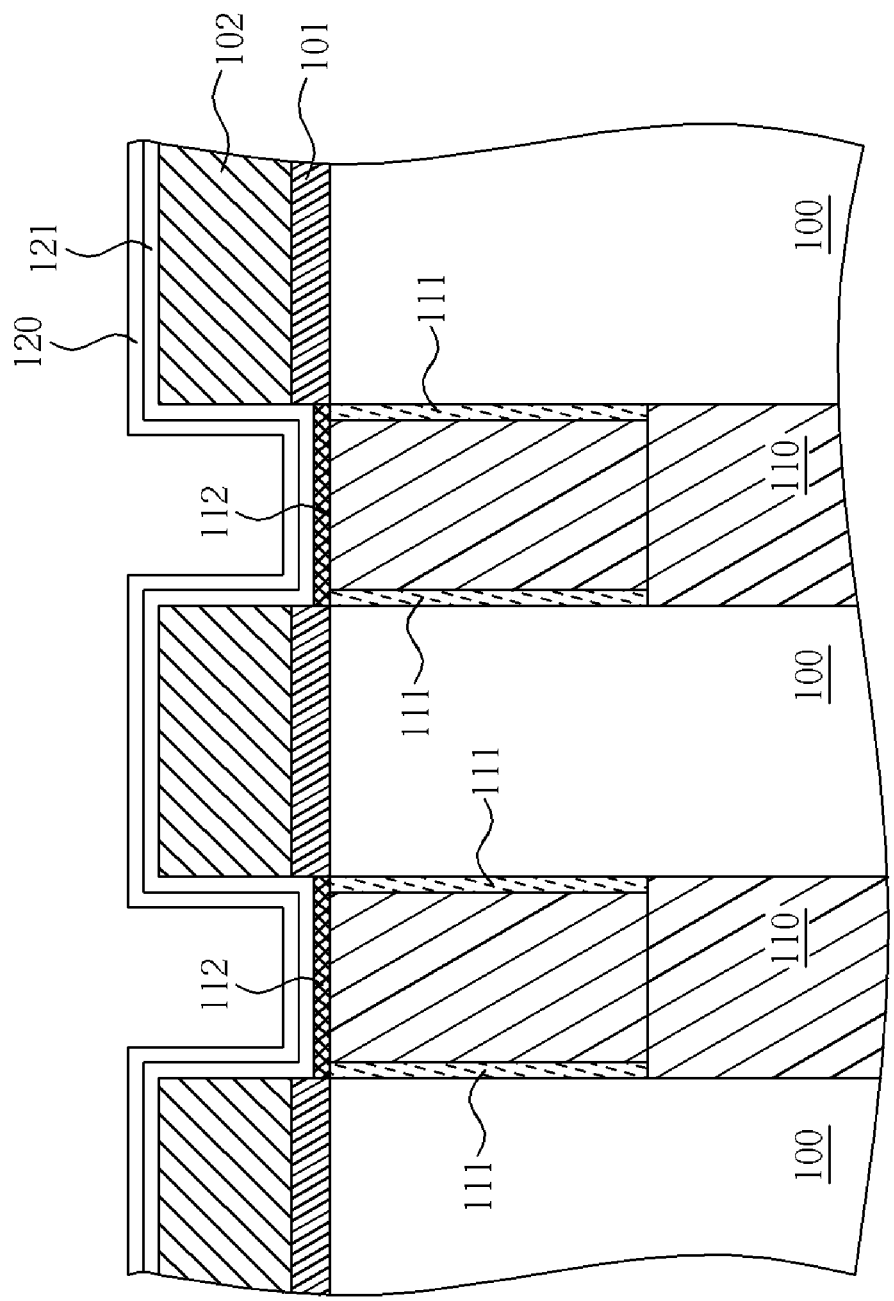

Then as shown in FIG. 3, a nitride liner 121 and a poly-Si layer 120 is formed to conformally cover the pad layer 102 and the conductive connection layer 112. The poly-Si layer 120 may be formed by the chemical vapor deposition (CVD). Preferably, the thickness of the poly-Si layer 120 may be 500 Å-1000 Å.

Figure 4:
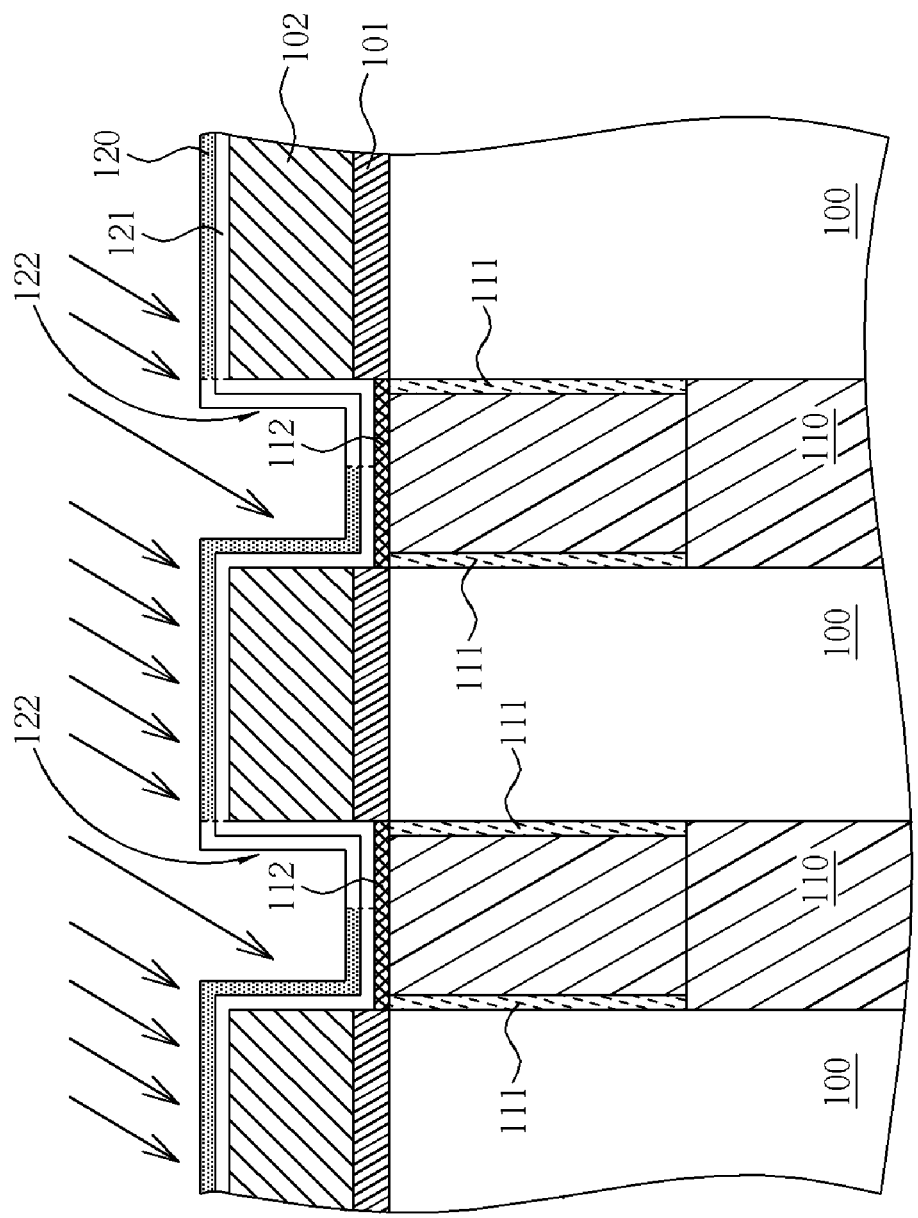

Afterwards, as shown in FIG. 4 a selective ion implantation with a tilt angle is perform to make part of the poly-Si layer 120 above the conductive connection layer 112 as an undoped poly-Si layer 122. Preferably, the selective ion implantation may be carried out by using $BF_2+$ at a tilt angle from 10° to 20°.

Figure 5:
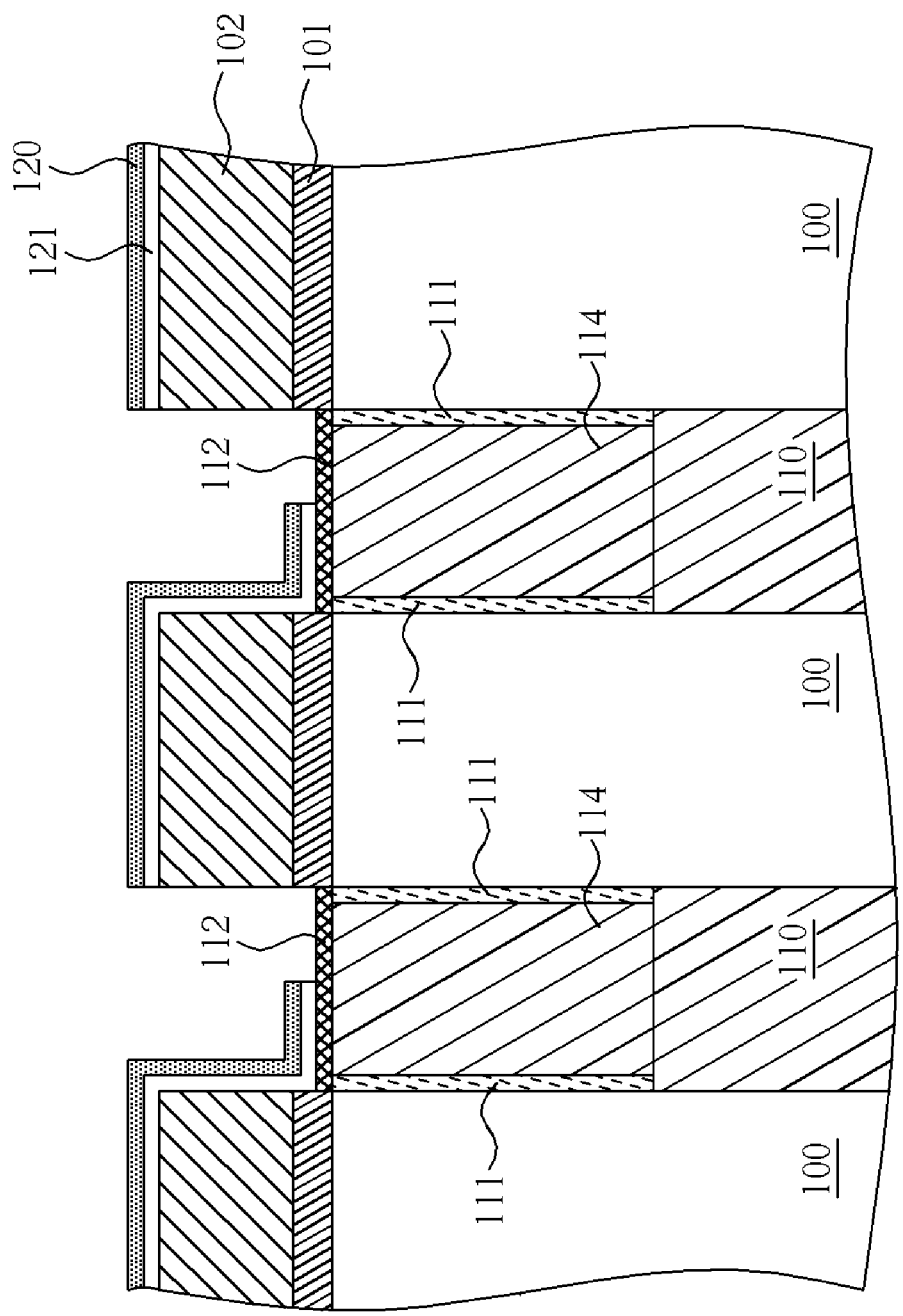

Later, as shown in FIG. 5 the undoped poly-Si layer 122 and the corresponding nitride liner 121 are selectively removed to expose part of the conductive connection layer 112. The undoped poly-Si layer 122 and the corresponding nitride liner 121 may be removed by a dry etching method or a wet etching method with aqueous ammonia.

Then, the exposed conductive connection layer 112 is removed by dry etching using the remaining poly-Si layer 120 and the nitride liner 121 as a hard mask, and simultaneously the poly-Si layer 120 is removed. Thereafter, the conductive connection layer 112 is formed a conductive connection strap 113.

Figure 6:
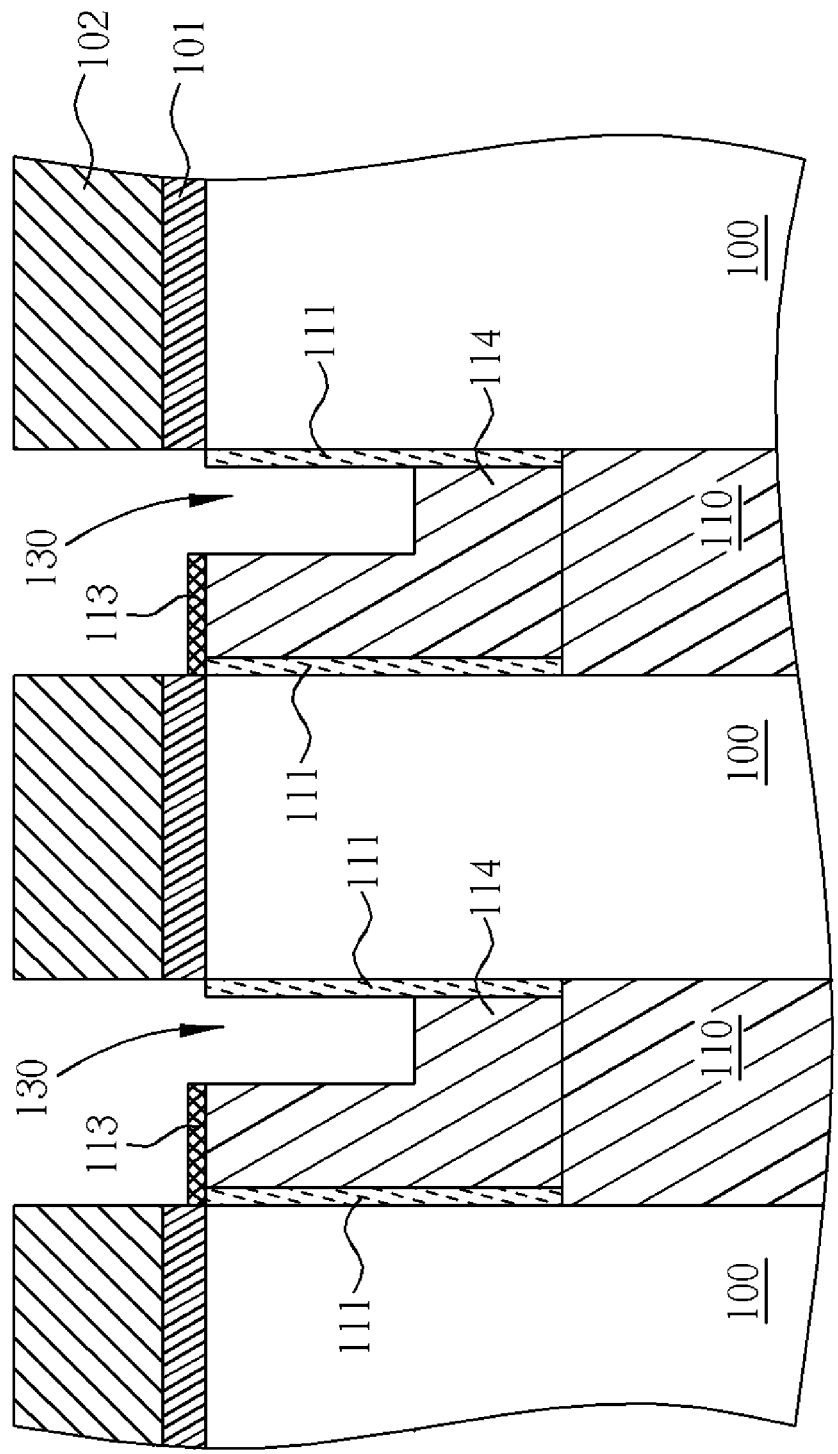

Afterwards as shown in FIG. 6, the exposed capacitor content 114 is etched by dry etching or wet etching using the nitride liner 121 as the hard mask to form a recess 130 in the deep trench capacitor 110. Then the rest of the nitride liner 121 is removed.

Figure 7:
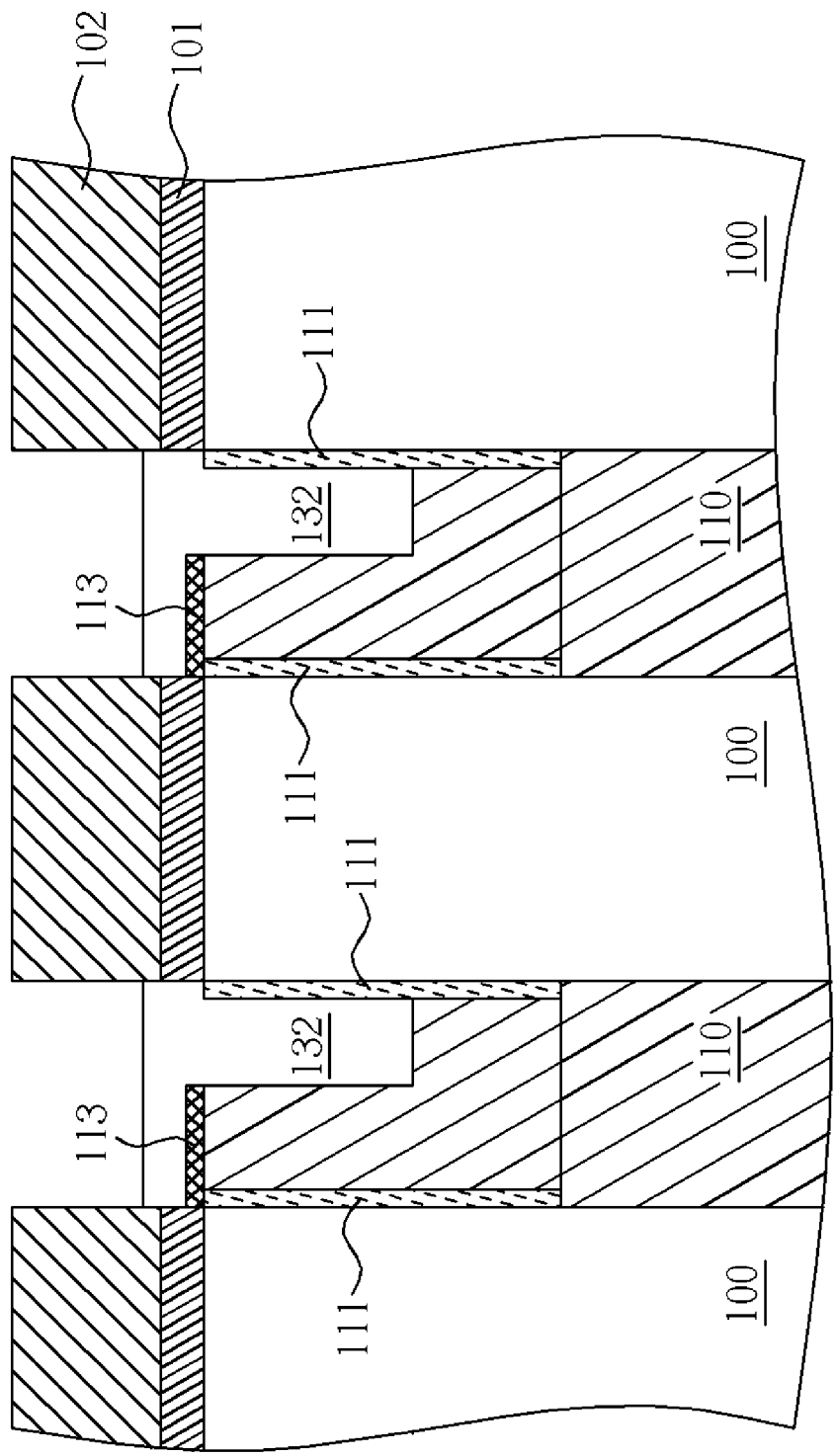

Later as shown in FIG. 7, the recess 130 is filled with an insulation material and meanwhile covering the conductive connection strap 113 to form a shallow trench isolation 132. The procedure may be first an insulation material is entirely deposited, then etched back, such as wet etching, to exposed part of the pad layer 102. The insulation material may include a SiO layer, doped glass and undoped glass.

Figure 8:
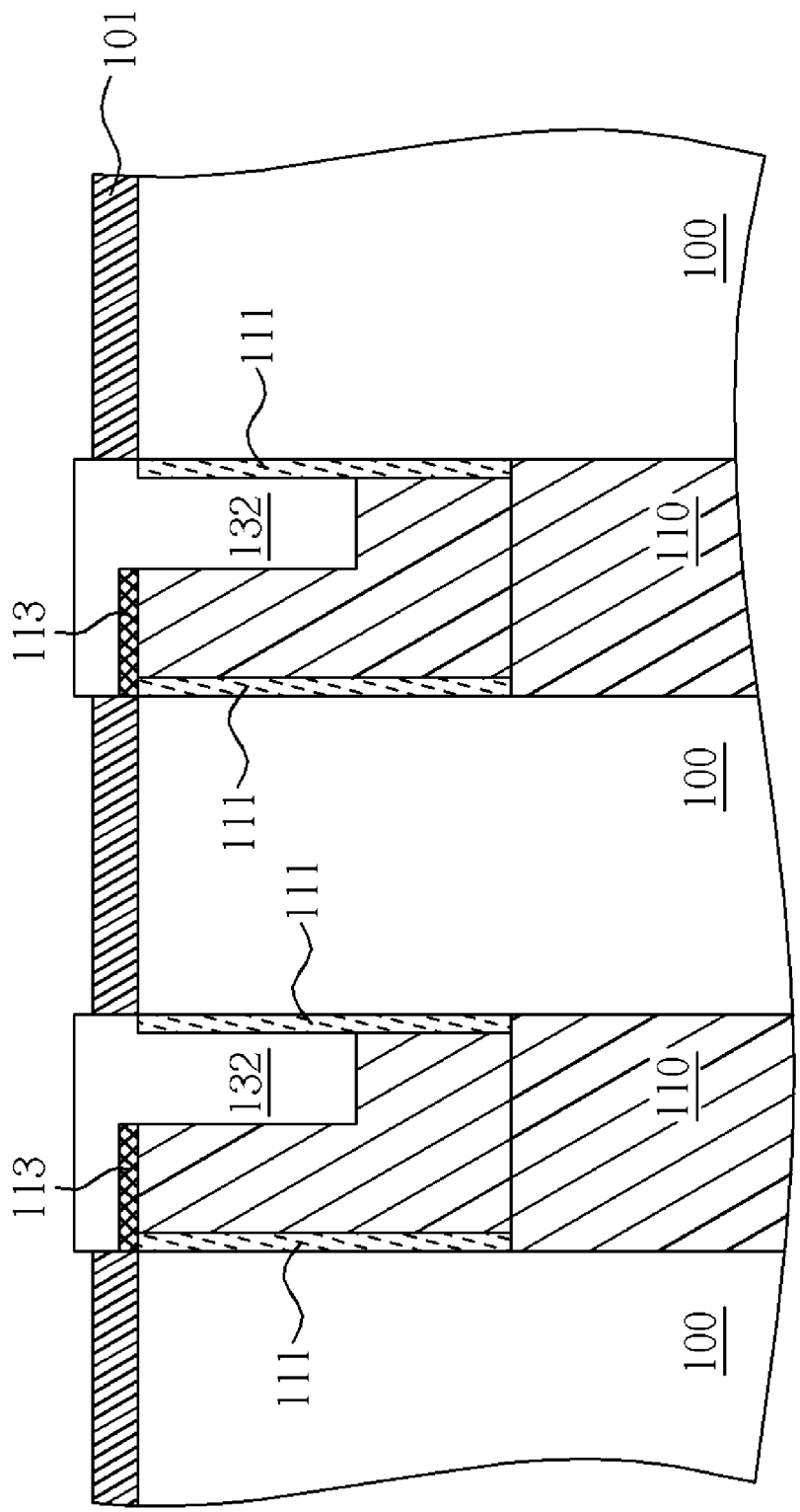

Then as shown in FIG. 8, the pad layer 102 is removed to expose the conductive layer 101. The pad layer can be removed by a wet etching process such as hot phosphoric acid.

Figure 9:
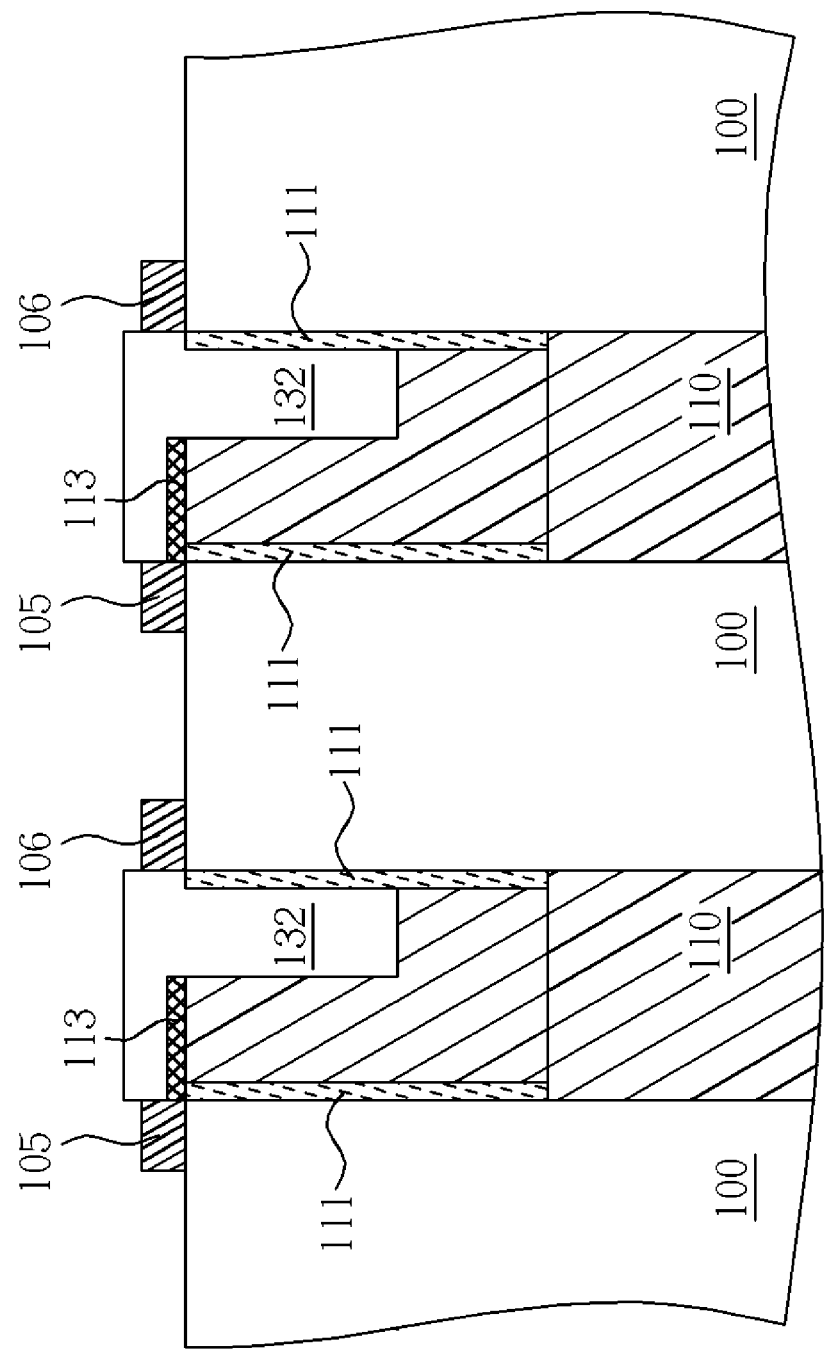

Afterwards as shown in FIG. 9, part of the conductive layer 101 can be selectively removed by a lithographic process plus an etching process to form a first conductive strap 105 which forms the surface strap together with the conductive connection strap 113. After the surface strap is completed, the process may proceed with the forming of the gate, source and the drain.

Preferably, part of the conductive layer 101 can be selectively removed together with the formation of the first conductive strap 105 to form a second conductive strap 106 connected with the shallow trench isolation 132, therefore, the first conductive strap and the second conductive strap are formed relative sides of the shallow trench isolation 132. The second conductive strap 106 may serve as the contact pad connecting the source with a bit line.

The method for forming the surface strap of the present invention has many advantages. For example, the surface strap connecting the capacitor to the drain is formed on the substrate rather than in the substrate. This method can effectively solve the problem that the strong electric field in the vicinity of the buried strap has negative influence on the performance of the devices. Second the method of the present invention intervening between the procedure of the deep trench capacitor and the procedure of the gate and may accordingly act as the hard mask of the procedure of the deep trench capacitor. Moreover performing the procedure of the surface strap before the procedure of the gate may simplify the process. Furthermore, if the conductive strap is made of a material with conductivity better than poly-Si, the electric resistance between the drain and the deep trench capacitor may be substantially lowered.

Those skilled in the art will readily observe that numerous modifications and alterations of the device and method may be made while retaining the teachings of the invention.

What is claimed is:

1. A method for forming a surface strap of a DRAM device, comprising:
   providing a substrate having thereon a conductive layer and a pad layer on the conductive layer;
   forming an opening in the pad layer and the conductive layer;
   forming a capacitor trench into the substrate through the opening;
   forming a trench capacitor in the capacitor trench, wherein the opening exposes a top surface of a capacitor content of the trench capacitor;
   forming a conductive connection layer directly on the top surface of the capacitor content within the opening such that the conductive connection layer is in contact with the conductive layer;
   selectively removing a portion of the conductive connection layer and a portion of the capacitor content, thereby forming a conductive connection strap and a recess thereto;
   filling the recess with an insulation layer, wherein the insulation layer covers the conductive connection strap;
   removing the pad layer to expose the conductive layer; and
   selectively removing the conductive layer to form a first conductive strap that electrically connects with the conductive connection strap, wherein the conductive connection strap and the first conductive strap constitute the surface strap.

2. The method for forming a surface strap of a DRAM device according to claim 1, wherein the conductive layer has a thickness of less than 500 Å.

3. The method for forming a surface strap of a DRAM device according to claim 2, wherein the conductive layer is made of graphite.

* * * * *